(12) United States Patent
Honda et al.

(10) Patent No.: US 9,660,651 B2
(45) Date of Patent: May 23, 2017

(54) LEVEL SHIFT CIRCUIT

(71) Applicant: DENSO CORPORATION, Kariya, Aichi-pref. (JP)

(72) Inventors: Takuya Honda, Kariya (JP); Hirofumi Isomura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/140,841

(22) Filed: Apr. 28, 2016

(65) Prior Publication Data
US 2017/0019090 A1 Jan. 19, 2017

(30) Foreign Application Priority Data
Jul. 13, 2015 (JP) .................................. 2015-139726

(51) Int. Cl.
*H03K 19/0185* (2006.01)
*H03K 19/0175* (2006.01)

(52) U.S. Cl.
CPC ............... *H03K 19/018521* (2013.01); *H03K 19/017509* (2013.01)

(58) Field of Classification Search
CPC ........... H03K 5/003; H03K 19/017509; H03K 19/0185–19/018528
See application file for complete search history.

(56) References Cited

U.S. PATENT DOCUMENTS

| | | | | |
|---|---|---|---|---|
| 7,768,336 B2* | 8/2010 | Kim | ................... | H03K 19/0016 326/62 |
| 8,436,654 B2* | 5/2013 | Hirose | ........... | H03K 19/018521 326/63 |
| 8,779,829 B2* | 7/2014 | Yamaguchi | ...... | H03K 3/356104 327/333 |
| 2006/0061386 A1 | 3/2006 | Kanzaki | | |
| 2007/0257724 A1 | 11/2007 | Suzuki | | |
| 2007/0268059 A1 | 11/2007 | Sakaguchi et al. | | |
| 2009/0002026 A1 | 1/2009 | Kanzaki | | |
| 2010/0109745 A1 | 5/2010 | Kanzaki | | |

FOREIGN PATENT DOCUMENTS

JP 2007-201704 A 8/2007

* cited by examiner

*Primary Examiner* — Patrick O'Neill
(74) *Attorney, Agent, or Firm* — Posz Law Group, PLC

(57) ABSTRACT

An input part is supplied with a low voltage from a low voltage power supply line. A level shift part and an output part are supplied with a high voltage from a high voltage power supply line. An input terminal is pulled up by a resistor and connected to the level shift part through a buffer circuit and an inverter circuit. The level shift part is connected in series with an NMOS and turned on when the input terminal changes to a low level. The output terminal is pulled up by a resistor through the buffer circuit. Even when the level shift part operates unstably because of long delay time from rising of a potential of the high voltage power supply line to rising of a potential of the low voltage power supply line, the output voltage is maintained at a high level.

12 Claims, 5 Drawing Sheets

LEVEL SHIFT CIRCUIT

CROSS REFERENCE TO RELATED APPLICATION

The present application is based on Japanese patent application No. 2015439726 filed on Jul. 13, 2015, the content of which is incorporated herein by reference.

FIELD

The present disclosure relates to a level shift circuit.

BACKGROUND ART

In a level shift circuit having a low voltage power supply and a high voltage power supply as exemplified in JP 2007-201704 A, for example, an operating current to a differential pair is cut off in accordance with an input signal state to reduce current consumption. In this configuration, when signals of an input terminal and an output terminal are at high levels, for example, these signals are subjected to a logic operation by a NAND circuit to cut off the operating current of the differential pair in response to an output of the NAND circuit.

When the two power supplies are activated, a low voltage power supply voltage occasionally rises later than a high voltage power supply voltage. When the low voltage power supply voltage rises with delay under a state of no input signal and high impedance, outputs of the NAND circuit and inverter circuit, which are operated with the low voltage power supply, often become unstable. A cut-off transistor forming a differential pair and a transistor at an output stage responsively turns on. As a result, the output signal is not maintained at a high level and changed to a low level.

SUMMARY

The present disclosure provides a level shift circuit, which is capable of maintaining an output normally even when two different power supply voltages rise at different time.

According to one aspect, a level shift circuit comprises a common power supply line, a first power supply line for supplying a first voltage relative to the common power supply line, a second power supply line for supplying a second voltage different from the first voltage relative to the common power supply line, an input terminal for receiving an input signal, an output terminal for outputting an output signal, and a level shift part provided between the common power supply line and the second power supply line and operable with the second voltage for converting the input signal corresponding to the first voltage to the output signal corresponding to the second voltage.

The level shift circuit further comprises an operation control switch, a first potential setting circuit, a second potential setting circuit and an off-fixing circuit. The operation control switch controls operation of the level shift part. The first potential setting circuit fixes a potential of the input terminal to a predetermined potential when the input terminal is in a high impedance state with no input signal applied to the input terminal. The second potential setting circuit sets a potential of the output terminal to a predetermined potential when the input terminal is in the high impedance state. The off-fixing circuit inhibits the operation of the level shift part by fixing the operation control switch to an off-state until a voltage of the first power supply line reaches the first voltage.

DETAILED DESCRIPTION OF THE EMBODIMENTS

First Embodiment

Figure 1:
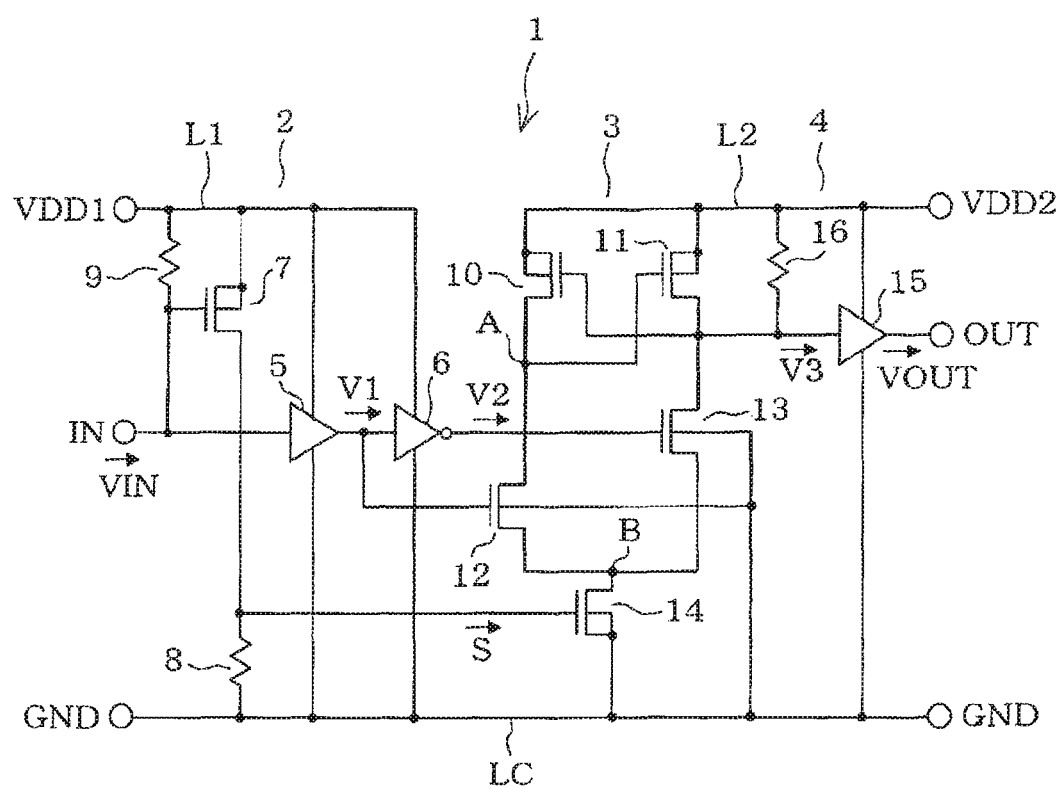
FIG. 1 is an electric circuit diagram showing a first embodiment of a level shift circuit.

A first embodiment of a level shift circuit will be described below with reference to FIG. 1 and FIG. 2. In a level shift circuit 1 shown in FIG. 1, a low voltage power supply VDDL is supplied as a first power supply to a low voltage power supply line L1, which is a first power supply line, and a high voltage power supply VDDH is supplied as a second power supply to a high voltage power supply line L2, which is a second power supply line. A common power supply line LC is connected to a ground terminal GND.

The level shift circuit 1 includes an input part 2, a level shift part 3 and an output part 4. The input part 2 has a low voltage power supply terminal VDD1, an input terminal IN and a ground terminal GND. A voltage is supplied from the low voltage power supply VDDL to the low voltage power supply terminal VDD1. An input signal is applied to the input terminal IN. The ground terminal GND is connected to a ground potential. The output part 4 has a high voltage power supply terminal VDD2, an output terminal OUT and a ground terminal GND. A voltage is supplied from a high voltage power supply VDDH to the high voltage power supply terminal VDD2.

In the input part 2, the low voltage power supply line L1 is connected to the low voltage power supply terminal VDD1 and the common power supply line LC is connected to the ground terminal GND. The input terminal IN is connected to the level shift part 3 through a buffer circuit 5 and an inverter circuit 6. The buffer circuit 5 and the inverter circuit 6 are supplied with power from the low voltage power supply line L1. A series circuit of a p-channel MOSFET (referred to as PMOS) 7 and a resistor 8 is connected between the low voltage power supply line L1 and the common power supply line LC. A gate of the PMOS 7 is connected to the input terminal IN. The PMOS 7 and the resistor 8 form an off-fixing circuit. A resistor 9 is connected between the low voltage power supply line L1 and the input terminal IN.

The level shift part 3 uses a differential amplifier of a p-channel current mirror type, which includes two p-channel MOSFETs 10, 11 and two n-channel MOSFETs (referred to as NMOSs below) 12, 13. The level shift circuit 3 and the output part 4 are supplied with power from the high voltage power supply line L2. AN n-channel MOSFET (NMOS) 14 is connected in series with the level shift part 3 and the common power supply line LC. The NMOS 14 operates as an operation control switch and provided as a first MOSFET. The PMOS 7 operates as a second MOSFET.

A source of the PMOS 10 is connected to the high voltage power supply line L2. A drain of the PMOS 10 is connected to the common power supply line LC through a drain-source path of the NMOS 12 and a drain-source path of the NMOS 14. A source of the PMOS 11 is connected to the high voltage power supply line L2. A drain of the PMOS 11 is connected to the common power supply line LC through a drain-source path of the NMOS 13 and the drain-source path of the NMOS 14. A gate of the PMOS 10 is connected to a drain of the PMOS 11. A gate of the PMOS 11 is connected to a drain of the PMOS 10. The drain of the PMOS 11 is connected to the output part 4.

In the output part 4, a buffer circuit 15 is supplied with power from power supply line L2 and outputs a signal, which is inputted from the drain of the PMOS 11 of the level shift circuit 3, to the output terminal OUT. A resistor 16 is connected between an input terminal of the buffer circuit 15 and the high voltage power supply line L2.

The resistor 9 pulls up a potential of the input terminal IN and operates as a first potential setting circuit and a first resistive functional element. The resistor 16 also pulls up a potential of the output terminal OUT and operates as a second potential setting circuit and a second resistive functional element. The PMOS 7 and the resistor 8 are an off-fixing circuit, which controls driving of the NMOS 14. The resistor 8 is provided as a third resistive functional element and operates as a pull-down resistor.

The operation of the first embodiment will be described next with reference to FIG. 2. As exemplified in (a) and (b) of FIG. 2, the power supply voltage of the low voltage power supply VDDL at the low voltage power supply terminal VDD1 rises at time t1 occasionally with a time delay after rising of the power supply voltage of the high voltage power supply VDDH at the high voltage power supply terminal VDD2, which rises at time W. Further, the voltage of the low voltage power supply VDDL rises slowly occasionally relative to the speed of rising of the voltage of the high voltage power supply VDDH. When the voltages of the high voltage power supply VDDH and the low voltage power supply rise at different times with time delay therebetween, a potential VOUT of the output terminal OUT becomes unstable because of variation in the potential of the input terminal IN.

Figure 2:
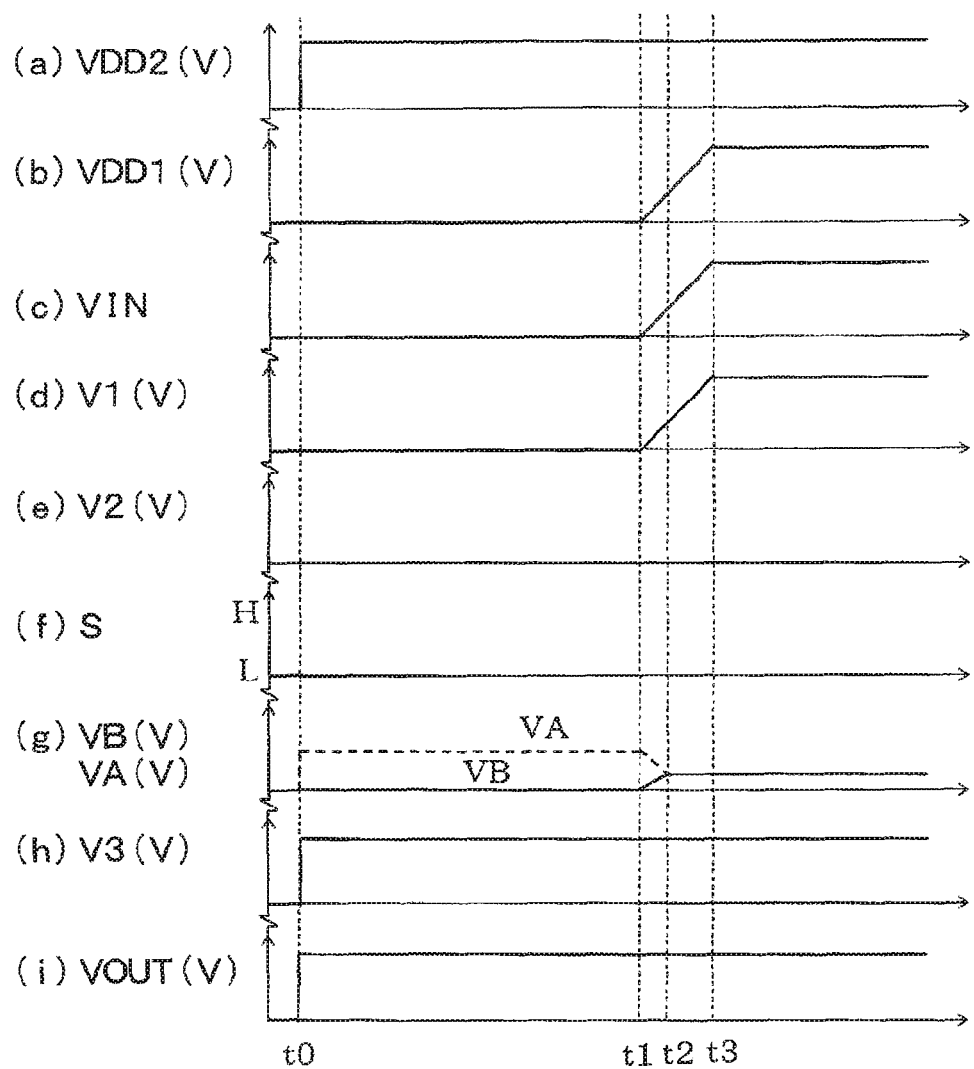
FIG. 2 is a time chart showing signal level changes at various points in the first embodiment shown in FIG. 1.

When the voltage of the high voltage power supply terminal VDD2 rises at time t0 as shown in (a) of FIG. 2, the voltage of the low voltage power supply terminal VDD1 does not rise yet as shown in (b) of FIG. 2. The potential of the low voltage power supply line L2 is still the ground potential. The resistor 8 operates as the pull-down resistor. The NMOS 14 is in the off-state because its gate voltage is the ground level. For this reason, the level shift circuit 3 does not operate.

When no input signal is inputted from an external side to the input terminal IN, the potential of the input terminal IN varies following the potential of the low voltage power supply line L1 because of the pull-up resistor 9. As a result, when the voltage of the low voltage power supply VDD1 starts rising from time t1, the potential VIN of the input terminal IN, to which no input signal is applied, rises with the potential of the low voltage power supply terminal VDD1 as shown in (c) of FIG. 2.

Further, as shown in (d) of FIG. 2, an output voltage V1 of the buffer circuit 5 also rises similarly with the voltage of the low voltage power supply line L1, that is, with the voltage of the low voltage power supply terminal VDD1.

The inverter circuit 6 is initially in a state of outputting a low level as shown in (e) of FIG. 2 and changes to an operative state following the voltage rise of the low voltage power supply line L1. At this time, the low level output state is maintained as long as the level of the input signal changes to the high level.

Since the buffer output voltage V1, which varies as shown in (d) of FIG. 2, is applied to the gate of the NMOS 12 of the level shift part 3, the NMOS 12 gradually turns on with the voltage V1 rising from time t1 and the potentials between the drain and the source of the NMOS 12 become generally equal. Thus a potential difference between connection nodes A and B becomes zero and potentials VA and VB of the connection nodes A and B become substantially equal as shown in (g) of FIG. 2. Since the inverter output voltage V2 (low level signal) is applied from the inverter circuit 6 to the gate of the NMOS 13 of the level shift part 3, the NMOS 13 remains in the off-state. The potential of the connection node B does not affect the output voltage V3 of the NMOS 13.

Since the NMOS 13 is in the off-state, the input part of the buffer circuit 15, that is, the drain of the NMOS 13, is pulled up to the potential of the high voltage power supply line L2 by the pull-up resistor 16 as shown in (h) of FIG. 2. Thus the PMOS 10 receives a bias of high level at its gate and remains in the off-state. Since the source and the drain of the PMOS 11 are maintained at the same potentials, the on-off state between these terminals is not affected. Since the input voltage V3 of the buffer circuit 15 is maintained at the high level, the output voltage VOUT of the output terminal OUT equals the voltage of the high voltage power supply line L2 as shown in (i) of FIG. 2.

As a result, even when the voltage VIN of the input terminal IN varies following rising of the low voltage power supply VDD1, the output voltage VOUT of the output terminal OUT can be maintained at the high level whatever the NMOSs 12 and 13 of the level shift part 3 operate in response to the variation of the input voltage VIN.

According to the first embodiment described above, the resistor 9 is connected between the input terminal IN and the low voltage power supply line L1, and the resistor 16 is connected between the output terminal OUT and the high voltage power supply line L2. Further, the PMOS 7 is provided to maintain the off-state of the NMOS 14 under the state that the input terminal IN is in the high impedance state, and the off-fixing circuit including the resistor 8 is provided.

Thus, even when the power supply voltage VDD1 rises under the state that the input terminal IN is in the high impedance state, the output voltage VOUT can be maintained stably by pulling up the input terminal IN and the output terminal OUT by the resistors 9 and 16. Further, the output voltage VOUT of the output terminal OUT can be restricted from varying by eliminating the unstable operation caused by the time delay between risings of the high voltage power supply VDD1 and the low voltage power supply VDD2 with the configuration for reduction of power consumption attained by stopping the operation of the level shift part 3.

Second Embodiment

Figure 3:
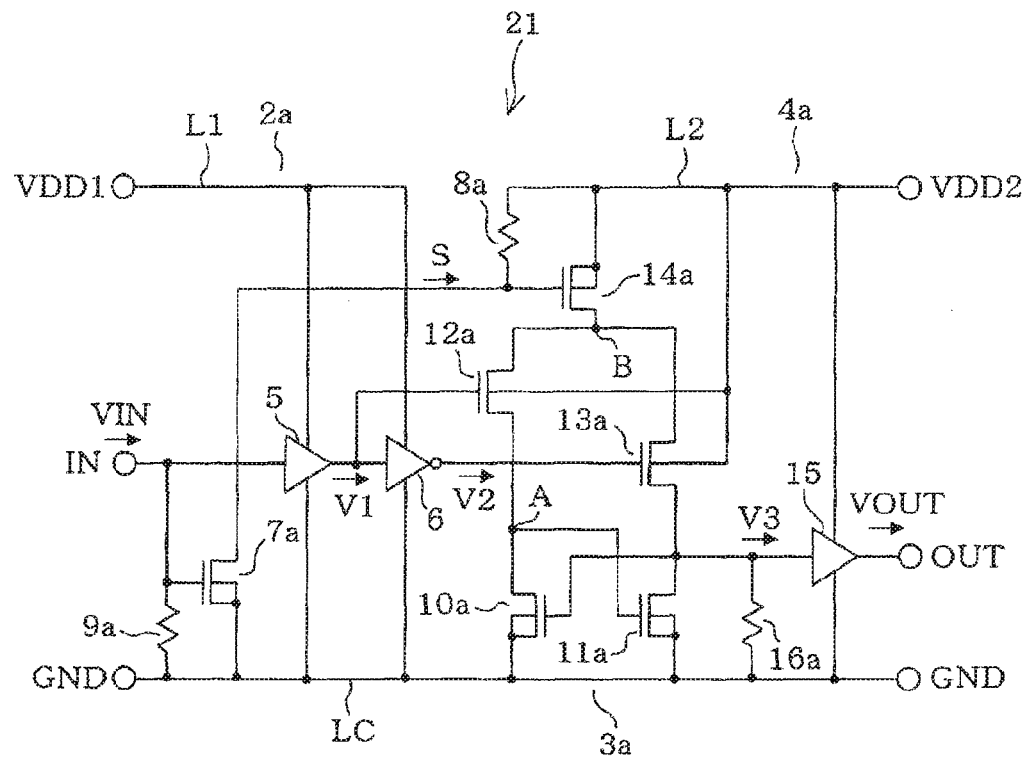
FIG. 3 is an electric circuit diagram showing a second embodiment of a level shift circuit.

A second embodiment is shown in FIG. 3 and different from the first embodiment as described below. In the second embodiment, a level shift circuit 21 is provided with a level shift part 3a, which is configured by replacing the p-channel MOSFETs and the n-channel MOSFETs in the first embodiment with each other. An operation control switch is formed of a p-channel MOSFET 14a.

That is, in FIG. 3, the level shift circuit 21 includes an input part 2a, the level shift part 3a and an output part 4a. In the input part 2a, the input terminal IN is connected to the level shift circuit 3a through the buffer circuit 5 and the inverter circuit 6. The off-fixing circuit is formed of a series circuit of a resistor 8a and an n-channel MOSFET 7a connected between the high voltage power supply line L2 and the common power supply line LC. A gate of the NMOS 7a is connected to the input terminal IN. A resistor 9a is connected between the common power supply line LC and the input terminal IN.

The level shift part 3a uses a differential amplifier of an n-channel current mirror type, which is formed of two n-channel MOSFET 10a, 11a and two p-channel MOSFETs 12a, 13a. The high voltage is supplied to the level shift part 3a and the output part 4a from the high voltage power supply terminal VDD2. The p-channel MOSFET 14a is connected in series between the level shift part 3a and the high voltage power supply line L2.

A source of the NMOS 10a is connected to the common power supply line LC and a drain of the NMOS 10a is connected to the high voltage power supply line L2 through a drain-source path of the PMOS 12a and a drain-source path of the PMOS 14a. A source of the NMOS 11a is connected to the common power supply line LC and a drain of the NMOS 11a is connected to the high voltage power supply line L2 through a drain-source path of the PMOS 13a and a drain-source path of the PMOS 14a. A gate of the NMOS 10a is connected to the drain of the NMOS 11a. A gate of the NMOS 11a is connected to the drain of the NMOS 10a. The drain of the NMOS 11a is connected to the output part 4.

In the output part 4a, the buffer circuit 15 is provided to be supplied with power from the high voltage power line L2 and output a signal VOUT, which is inputted from the drain of the NMOS 11a of the level shift part 3a, to the output terminal OUT A resistor 16a is connected between the input terminal of the buffer circuit 15 and the common power supply line LC.

The resistor 9a pulls down a potential of the input terminal IN and operates as the first potential setting circuit and the first resistive functional element. The resistor 16a pulls down a potential of the output terminal OUT and operates as the second potential setting circuit and the second resistive functional element. The NMOS 7a and the resistor 8a form the off-fixing circuit, which controls driving of the PMOS 14a. The resistor 8a is the third resistive functional element. The PMOS 14a operates as the second MOSFET. The resistor 8a operates as a pull-up resistor. The PMOS 14a operates as the operation control switch.

An operation of the second embodiment configured as described above will be described below. Similarly to the first embodiment, it is assumed that the voltage of the low voltage power supply terminal VDD1 rises after a delay time from rising of the voltage of the high voltage power supply terminal VDD2. When the potential of the high voltage power supply terminal VDD2 rises, the potential of the low voltage power supply terminal VDD1 does not rise yet and the potential of the low voltage power supply line L2 is nearly the ground potential.

Under the high impedance state, in which no input signal is applied to the input terminal IN from an external side, the potential of the input terminal IN is fixed to the potential of the common power supply line LC by the pull-down resistor 9a. As a result, the NMOS 7a remains in the off-state. The resistor 8a operates as the pull-up resistor. The gate potential of the PMOS 14a equals the source potential and remains in the off-state. Thus the level shift part 3a does not operate.

When the potential of the low voltage power supply terminal VDD1 gradually rises, the buffer circuit 5 and the inverter circuit 6 start to operate with the operating power supply of low voltage. However, since the potential of the input terminal IN is fixed to the ground level and in the low level state under this situation, the output voltage V1 of the buffer circuit 5 is maintained at the low level and the inverter circuit 6 outputs the high level signal. Since the PMOS 14a is maintained in the off-state in this situation, the drain of the NMOS 11a is maintained at the low level by the pull-down resistor 16a and remains in the off-state. Although the PMOSs 12a and 12b of the level shift part 3a therefore may turn on and off irregularly, the output voltage VOUT of the output terminal OUT can be maintained at the low level without being affected by such irregular variations.

As a result, even when the voltage VIN at the input terminal IN varies with rising of the voltage of the low voltage power supply VDD1, the output voltage VOUT of the output terminal OUT can be maintained at the low level irrespective of the operation states of the PMOSs 12a and 13a of the level shift part 3a, which are caused by such variations. The second embodiment thus provides the similar operation and advantage as the first embodiment.

Third Embodiment

Figure 4:
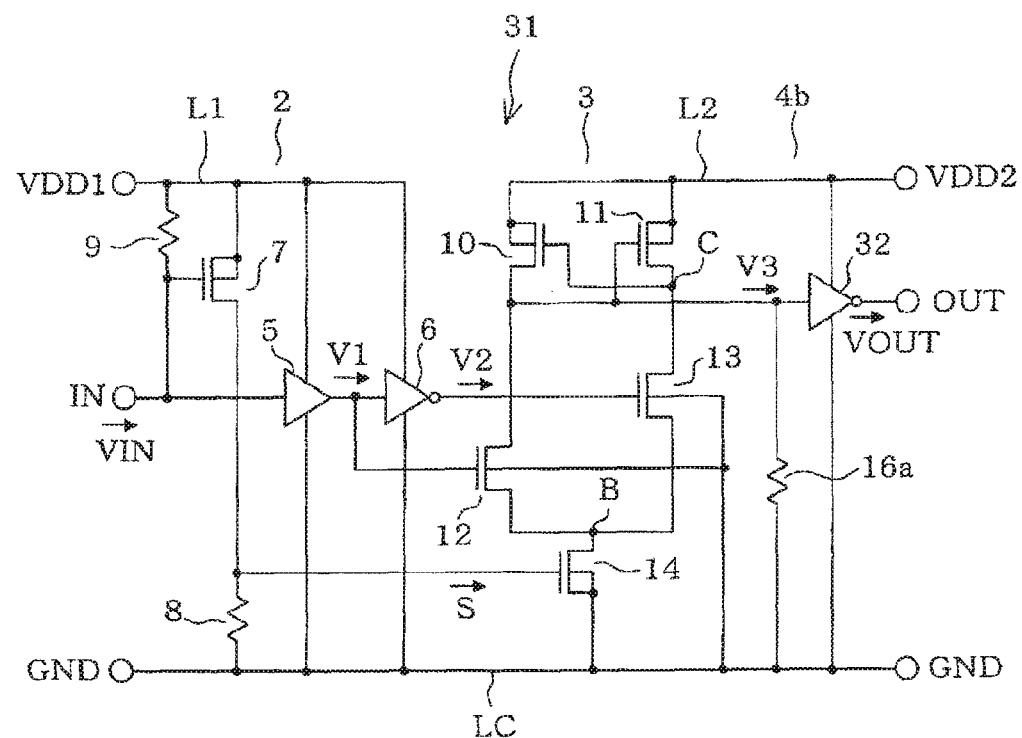
FIG. 4 is an electric circuit diagram showing a third embodiment of a level shift circuit.

A third embodiment is shown in FIG. 4 and different from the first embodiment as described below. As shown in FIG. 4, a level shift circuit 31 includes an output part 4b, which is formed of a resistor 16a connected to the common power supply line LC as a pull-down resistor in place of the resistor 16 provided as the pull-up resistor 16 connected to the high voltage power supply line L2. The resistor 16a operates as a second resistive functional element and a second potential setting circuit.

An inverter circuit 32 is provided in place of the buffer circuit 15. As an output of the level shift circuit 3, the output developed at a junction between the drain of the PMOS 10 and the gate of the PMOS 11 is used and inputted to the input terminal of the inverter circuit 32. The output voltage of the level shift part 3 is opposite in phase to that of the first embodiment. However, the same output as the first embodiment is outputted by the inverting operation of the inverter circuit 32.

An operation of the third embodiment will be described below. Similarly to the first embodiment, it is assumed that the voltage of the low voltage power supply terminal VDD1 rises after a delay time from rising of the voltage of the high voltage power supply terminal VDD2. When the potential of the high voltage power supply terminal VDD2 rises, the potential of the low voltage power supply terminal VDD1 does not yet rise and the potential of the low voltage power supply line L2 is nearly the ground potential. As a result, the resistor 8 operates as the pull-down resistor. The NMOS 14 remains in the off-state and the level shift part 3 does not operate.

In the configuration described above, the input potential VIN rises following the gradual rising of the voltage of the low voltage power supply terminal VDD1 under the high impedance state, in which no input signal is applied to the input terminal IN. The output voltage V1 of the buffer circuit 5 also similarly rises with the potential of the low voltage power supply VDD1. The inverter circuit 6 maintains the low level output state because the level of the output voltage V1 changes to the high level.

Since the voltage V1 is applied from the buffer circuit 5 to the NMOS 12 of the level shift circuit 3, the NMOS 12 gradually changes to the on-state with the gradual rise of the voltage V1 and the potentials of the drain and the source substantially become equal. Since the NMOS 14 is in the off-state at this time, the output voltage V3 of the level shift part 3 is pulled down to the potential of the common power supply line LC by the resistor 16a and fixed to the low level.

Since the output voltage V3 of the level shift part 3 is at the low level, the PMOS 11 is turned on. With the potential of the drain, which is the node C, being at the high level, the PMOS 10 is maintained in the off-state. As a result, since the inverter circuit 32 inverts the voltage V3 and outputs an inverted voltage, the output voltage VOUT of the high level is outputted from the output terminal OUT.

As a result, even when the voltage VIN at the input terminal IN varies with rising of the voltage of the low voltage power supply line L1, the output voltage VOUT of the output terminal OUT can be maintained at the high level irrespective of the operation states of the NMOSs 12 and 13 of the level shift part 3a, which are caused by such variations. The third embodiment thus also provides the similar operation and advantage as the first embodiment.

Fourth Embodiment

Figure 5:
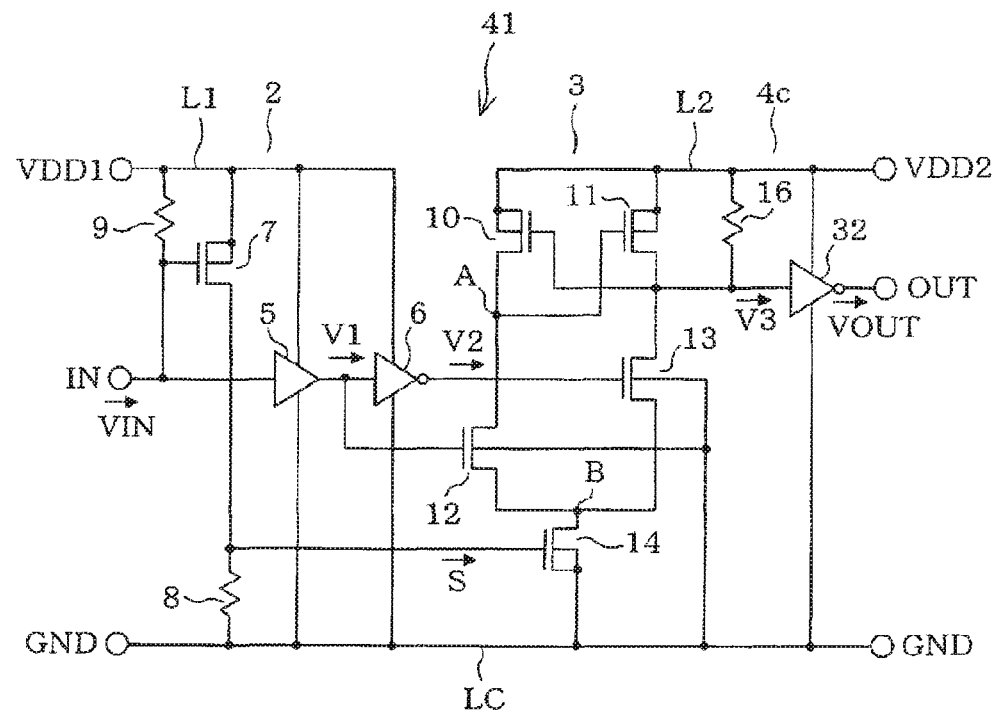
FIG. 5 is an electric circuit diagram showing a fourth embodiment of a level shift circuit.

A fourth embodiment is shown in FIG. 5 and different from the first embodiment as described below. In the fourth embodiment, an inverter circuit 32 is provided as an output part 4c in place of the buffer circuit 15.

With this configuration, the output voltage VOUT, which is inverted in phase from that of the first embodiment, is outputted from the output terminal OUT. That is, as described above, when the potential of the low voltage power supply terminal VDD1 rises with some time delay from rising of the potential of the high voltage power supply terminal VDD2 under the high impedance state of the input terminal IN, the output voltage VOUT is outputted from the inverter circuit 32 as the low level voltage and not the high level voltage. When the input voltage VIN of the input terminal IN is the low level, the output voltage VOUT of the output terminal OUT is outputted as the high level voltage. The fourth embodiment thus also provides the similar operation and advantage as the first embodiment except that the output voltage VOUT is inverted.

Fifth Embodiment

Figure 6:
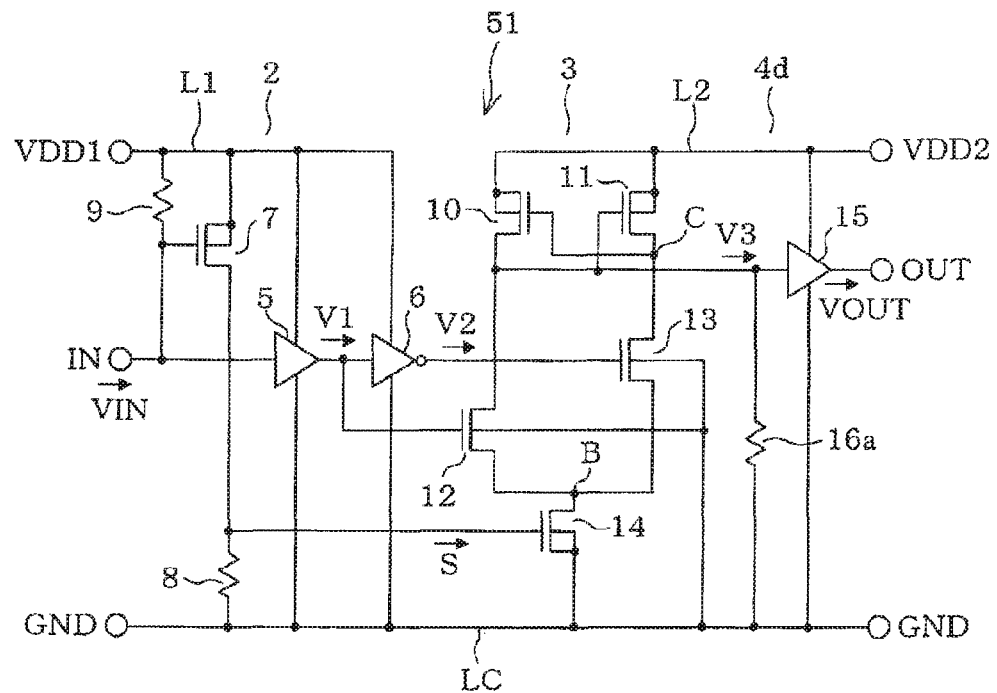
FIG. 6 is an electric circuit diagram showing a fifth embodiment of a level shift circuit.

A fifth embodiment is shown in FIG. 6 and different from the third embodiment shown in FIG. 4 as described below. In the fifth embodiment, the inverter circuit 32 provided as the output part 4b in the third embodiment is replaced with a buffer circuit 15. For this reason, the output voltage VOUT of the output terminal OUT in the third embodiment is outputted without being inverted by the inverter circuit 32. The fifth embodiment thus provides the similar operation and advantage as the third embodiment except that the level of output voltage VOUT is opposite.

Sixth Embodiment

Figure 7:
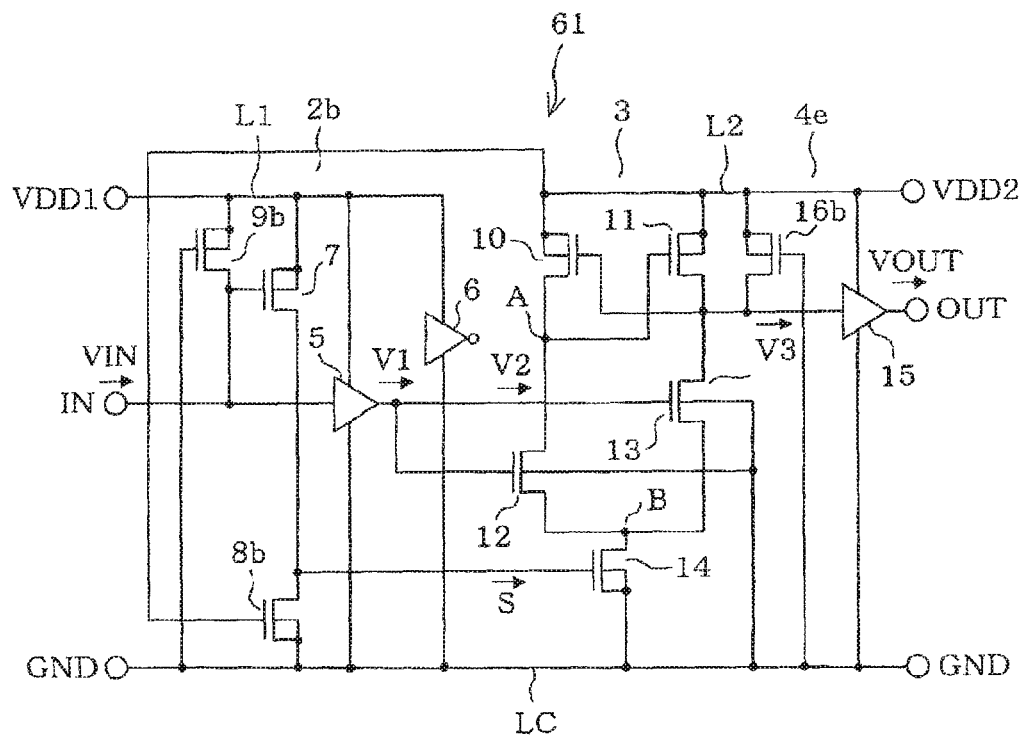
FIG. 7 is an electric circuit diagram showing a sixth embodiment of a level shift circuit.

A sixth embodiment is shown in FIG. 7 and different from the first embodiment as described below. In the sixth embodiment, MOSFETs are provided as resistive functional elements in place of the resistors 8, 9 and 16 provided in the first embodiment. The MOSFETs are used to operate as resistive elements to form an IC circuit and the like without providing resistors separately.

As shown in FIG. 7, a drain-source path of an n-channel MOSFET (NMOS) 8b is connected in place of the resistor 8. A gate of the NMOS 8b is connected to the high voltage power supply line L2. Since the NMOS 8b normally remains in the on-state after the high voltage power supply VDD2 rises, an on-resistance between its drain and source operates as a resistor.

A source-drain path of a p-channel MOSFET 9b is connected in place of the resistor 9. A gate of the PMOS 9b is connected to the common power supply line LC. A source-drain path of a p-channel MOSFET 16b is connected in place of the resistor 16. A gate of the PMOS 16b is connected to the common power supply line LC. Since each of the PMOSs 9b and 16b is normally in an on-state with its gate being fixed to the ground GND, an on-resistance between its source and drain operates as a resistor. The sixth embodiment thus provides the similar operation and advantage as the first embodiment.

Seventh Embodiment

Figure 8:
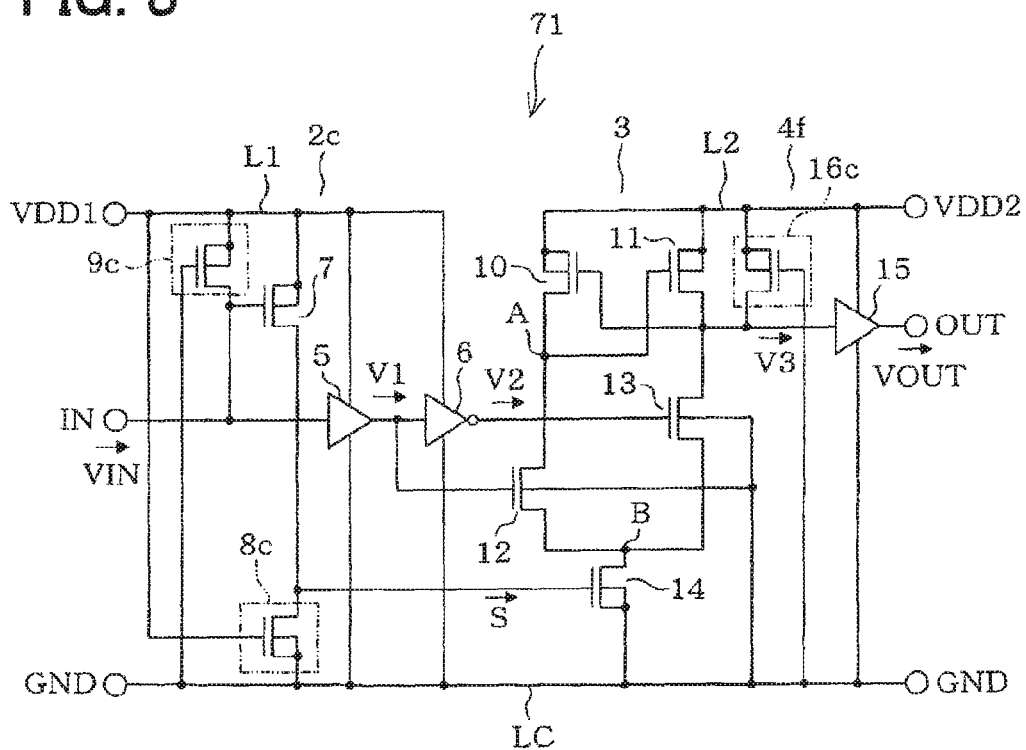
FIG. 8 is an electric circuit diagram showing a seventh embodiment of a level shift circuit.

A seventh embodiment is shown in FIG. 8 and different from the sixth embodiment as described below. In the seventh embodiment, in place of the NMOS 8b and the PMOSs 9b, 16b used in the sixth embodiment, depletion-type MOSFETs 8c, 9c and 16c are provided as MOSFETs of normally-on type. The depletion-type MOSFET is in the on-state without any voltage applied to its gate, because its threshold voltage is zero.

As shown in FIG. 8, a drain-source path of the depletion-type n-channel MOSFET (NMOS) 8c is connected in place of the NMOS 8b. A gate of the NMOS 8c is connected to the low voltage power supply line L1. An on-resistance of the drain-source path of the NMOS 8c operates as a resistor, since the NMOS 8c is normally in the on-state with its threshold voltage being zero. A source-drain path of the depletion-type p-channel MOSFET 9c is connected in place of the PMOS 9b. A gate of the PMOS 9c is also connected to the common power supply line LC. A source-drain path of the depletion-type p-channel MOSFET 16c is connected in place of the PMOS 16b. A gate of the PMOS 16c is also connected to the common power supply line LC. On-resistances of the source-drain paths of the PMOSs 9c and 16c operate as resistors, respectively, since the PMOSs 9c and 16c are normally in the on-states with respective threshold voltages being zero. The seventh embodiment also provides the similar operation and advantage of the first embodiment.

Other Embodiment

The level shift circuit is not limited to the embodiments described above but may be configured differently as exemplified below.

In each of the embodiments described above, the resistors 9, 9a, which correspond to the first resistive functional elements, and the resistors 16, 16a, which correspond to the second resistive functional elements, or the MOSFETs 9b, 9c and MOSFETs 16b, 16c are provided as the first and second potential setting circuits, respectively. However, a variety of other elements, which are operable as resistive functional elements, may be used, and a variety of other potential setting circuits, which are not resistors but operable to fix potentials to predetermined potentials, may be used.

Although the resistors 8, 8a or the MOSFETs is 8b, 8c are provided as the third resistive functional elements, a variety of other elements operable as resistive functional elements may be used.

Although the MOSFETs 9b, 9c, 16b and 16c, which normally remain in on-states, are formed of normal MOSFETs, which are gate-biased to operate with threshold voltages, or depletion-type MOSFETs, a variety of other MOSFETs configured to be normally in on-states may be used.

Although each embodiment is exemplified to operate with the first voltage and the second voltage, which are assumed to be positive, the embodiment may be operated with negative voltages.

What is claimed is:

1. A level shift circuit comprising:
    a common power supply line;
    a first power supply line, which supplies a first voltage relative to the common power supply line;
    a second power supply line, which supplies a second voltage relative to the common power supply line, the second voltage being different from the first voltage;
    an input terminal, to which an input signal is applied;
    an output terminal, which outputs an output signal;
    a level shift part provided between the common power supply line and the second power supply line and operable with the second voltage, the level shift part converting the input signal corresponding to the first voltage to the output signal corresponding to the second voltage;
    an operation control switch for controlling operation of the level shift part;
    a first potential setting circuit for fixing a potential of the input terminal to a predetermined potential when the input terminal is in a high impedance state with no input signal applied to the input terminal;
    a second potential setting circuit for setting a potential of the output terminal to a predetermined potential when the input terminal is in the high impedance state; and
    an off-fixing circuit for inhibiting the operation of the level shift part by fixing the operation control switch to an off-state until a voltage of the first power supply line reaches the first voltage.

2. The level shift circuit according to claim 1, wherein:
    the first potential setting circuit includes a first resistive functional element provided between the input terminal and the first power supply line;
    the second potential setting circuit includes a second resistive functional element provided between the output terminal and the second power supply line; and
    the off-fixing circuit is configured to output an operation signal for the operation control switch when a potential difference between the first power supply line and the input terminal reaches a predetermined value.

3. The level shift circuit according to claim 2, wherein:
    the first resistive functional element and the second resistive functional element are resistors.

4. The level shift circuit according to claim 2, wherein:
    the first resistive functional element and the second resistive functional element are MOSFETs connected to be normally in on-states.

5. The level shift circuit according to claim 2, wherein:
    the operation control switch is a first MOSFET connected in series with the level shift part; and
    the off-fixing circuit includes a third resistive functional element, which supplies a gate bias to the first MOSFET, and a second MOSFET, which is provided to supply a current to the third resistive functional element and operate when a potential difference between the first potential setting circuit and the input terminal reaches a predetermined value.

6. The level shift circuit according to claim 2, wherein:
    the off-fixing circuit includes a MOSFET, which is normally in an on-state and has a source connected to the common power supply line, a drain connected to a control terminal of the operation control switch and a gate connected to the first power supply line.

7. The level shift circuit according to claim 1, wherein:
    the first potential setting circuit includes a first resistive functional element provided between the input terminal and the common power supply line;
    the second potential setting circuit includes a second resistive functional element provided between the output terminal and the common power supply line; and
    the off-fixing circuit is configured to output an operation signal for the operation control switch when a potential difference between the common power supply line and the input terminal reaches a predetermined value.

8. The level shift circuit according to claim 7, wherein:
    the operation control switch is a first MOSFET connected in series with the level shift part; and
    the off-fixing circuit includes a third resistive functional element, which supplies a gate bias to the first MOSFET, and a second MOSFET, which is provided to supply a current to the third resistive functional element and operate when a potential difference between the first potential setting circuit and the input terminal reaches a predetermined value.

9. The level shift circuit according to claim 7, wherein:
    the first resistive functional element and the second resistive functional element are MOSFETs connected to be normally in on-states.

10. The level shift circuit according to claim 7, wherein:
    the off-fixing circuit includes a MOSFET, which is normally in an on-state and has a source connected to the common power supply line, a drain connected to a control terminal of the operation control switch and a gate connected to the first power supply line.

11. The level shift circuit according to claim 1, wherein:
    the operation control switch is a first MOSFET connected in series with the level shift part; and
    the off-fixing circuit includes a third resistive functional element, which supplies a gate bias to the first MOSFET, and a second MOSFET, which is provided to supply a current to the third resistive functional element and operate when a potential difference between the first potential setting circuit and the input terminal reaches a predetermined value.

12. The level shift circuit according to claim 1, wherein:
    the off-fixing circuit includes a MOSFET, which is normally in an on-state and has a source connected to the common power supply line, a drain connected to a control terminal of the operation control switch and a gate connected to the first power supply line.

* * * * *